United States Patent [19]

Kusaba et al.

[11] Patent Number: 5,986,284
[45] Date of Patent: Nov. 16, 1999

[54] SEMICONDUCTOR DEVICE

[75] Inventors: Kazuyuki Kusaba; Makoto Iwamoto, both of Kanagawa, Japan

[73] Assignee: NEC Corporation, Tokyo, Japan

[21] Appl. No.: 09/064,867

[22] Filed: Apr. 22, 1998

[30] Foreign Application Priority Data

Apr. 22, 1997 [JP] Japan ................................ 9-104531

[51] Int. Cl.⁶ ............................................. H01L 23/58
[52] U.S. Cl. ............................ 257/48; 257/379; 257/922; 365/185.09
[58] Field of Search ............................. 257/48, 922, 328, 257/341, 379; 365/185.09, 185.33

[56] References Cited

U.S. PATENT DOCUMENTS 5,663,574  9/1997  Hierold et al. ............................ 257/48
5,864,501  1/1999  Lee .................................... 365/185.09
5,889,410  3/1999  El-Kareh et al. ........................ 324/769

FOREIGN PATENT DOCUMENTS 5-38915  5/1993  Japan ......................................... 257/48

*Primary Examiner*—Donald L. Monin, Jr.
*Attorney, Agent, or Firm*—Foley, Hoag & Eliot LLP

[57] ABSTRACT

A semiconductor device includes a semiconductor chip, a protective wiring layer, and an abnormality detector. At least one of integrated circuits is formed on the semiconductor chip. The protective wiring layer is formed to be spread on the integrated circuit at a very small interval, and made of a conductive light-shielding material. The protective wiring layer is applied with a power supply voltage upon operating the integrated circuit. The abnormality detector monitors the voltage applied to the protective wiring layer and outputs an abnormality detection signal when the monitored voltage is an abnormal voltage.

20 Claims, 4 Drawing Sheets

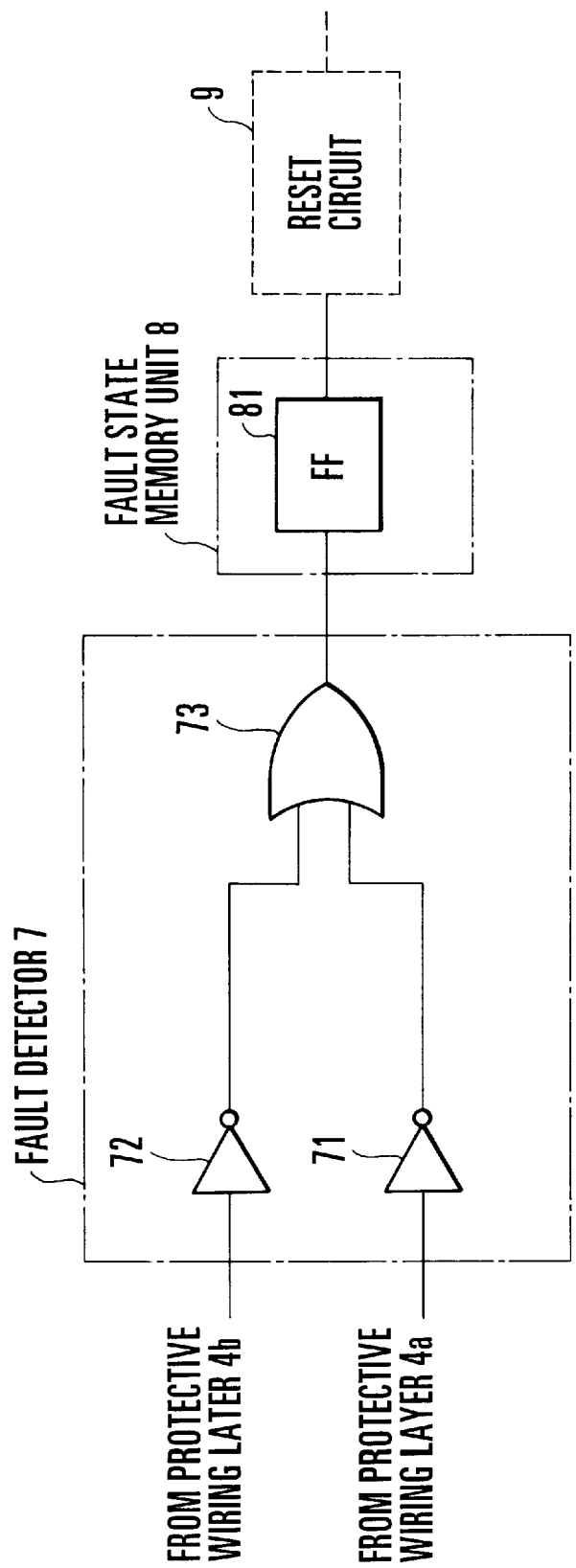
F I G. 2

SEMICONDUCTOR DEVICE

BACKGROUND OF THE INVENTION

The present invention relates to a semiconductor device constituted by a semiconductor chip having a protective wiring layer on an integrated circuit.

In recent years, electrically erasable programmable read only memories (EEPROMS) are being used as external memory devices in portable computers giving importance to communication functions.

A basic cell of a conventional EEPROM has a structure shown in FIG. 4. Referring to FIG. 4, a source 303 and a drain 304 are formed at a predetermined interval in a region defined by a field oxide film 302 on a p-type semiconductor substrate 301. A floating gate 306 electrically insulated from surroundings is formed through a gate insulating film 305 on the semiconductor substrate 301 and the drain 304 between the source 303 and the drain 304. A control gate 308 is formed on the floating gate 306 through an insulating film 307. The floating gate 306 and the control gate 308 are made of heavily doped polysilicon. Reference numeral 309 denotes an insulating film formed on the field oxide film 302 and the control gate 308.

In the above structure, part of the gate insulating film 305 between the floating gate 306 and the drain 304 is formed as thin as about 10 nm. In a data erase, when the control gate 308 is applied with a positive voltage much higher than a voltage to the drain 304, electrons enter the floating gate 306 from the drain 304. In a data write, by changing the polarity of the voltage applied to the control gate 108, the electrons within the floating gate 306 are removed to the drain 304. The electron flow passes through the thin gate insulating film 305 by a tunnel phenomenon.

When the floating gate 306 contains no electron, the transistor is turned on; when the floating gate 306 contains many electrons, a channel is hardly induced between the source 303 and the drain 304 by negative charges of electrons within the floating gate 306, and the transistor is not turned on. The two, ON and OFF states of the transistor correspond to data "0" and "1", respectively.

As described above, the EEPROM is advantageous in that data can be electrically written/erased in/from individual memory cells. However, data stored in the EEPROM is naturally erased by irradiation of ultraviolet rays.

For this reason, as disclosed in Japanese Utility Model Laid-Open No. 5-38915, a light-shielding film is conventionally formed on an EEPROM cell to shield the entrance of ultraviolet rays which causes a data erase. FIG. 5 shows a semiconductor chip having such a light-shielding film. An ultraviolet-shielding layer 403 is formed every memory cell in the region of an EEPROM 402 on a semiconductor chip 401 on which an integrated circuit is formed.

In the conventional semiconductor device, the ultraviolet-shielding layer 403 is only formed in the region of the EEPROM 402. If the ultraviolet-shielding layer 403 is damaged due to any reason, the damage to the layer 403 is not recognized until it is externally observed. Accordingly, the reliability of stored data cannot be assured.

More specifically, if the ultraviolet-shielding layer 403 is damaged, an EEPROM cell is irradiated with ultraviolet rays through this damaged region to damage the stored data. The damage to the ultraviolet-shielding layer 403 can be recognized by externally observing the semiconductor chip having an integrated circuit made up of the EEPROM 402. When, however, the semiconductor chip is incorporated in a data communication device or the like, the state of the EEPROM 402 cannot be always externally observed.

In this case, even if the ultraviolet-shielding layer is damaged, and thus the data is damaged, this state cannot be detected, and information processing is performed using abnormal data.

Since the ultraviolet-shielding layer 403 is formed on a word line or the like, the damage to the ultraviolet-shielding layer 403 may lead to damage or disconnection of an upper wiring layer constituting the EEPROM 402. Also in this case, the damage cannot be detected, and the device may malfunction owing to a defective semiconductor chip.

SUMMARY OF THE INVENTION

It is an object of the present invention to provide a semiconductor device capable of detecting the presence/absence of damage to a light-shielding layer formed on a semiconductor chip.

In order to achieve the above object, according to the present invention, there is provided a semiconductor device comprising a semiconductor chip on which at least one integrated circuit is formed, a protective wiring layer formed to be spread on the integrated circuit at a very small interval, and made of a conductive light-shielding material, the protective wiring layer being applied with a power supply voltage upon operating the integrated circuit, and abnormality detecting means for monitoring the voltage applied to the protective wiring layer and outputting an abnormality detection signal when the monitored voltage is an abnormal voltage.

BRIEF DESCRIPTION OF THE DRAWINGS

FIG. 2 is a circuit diagram of a fault detector and a fault state memory unit shown in FIG. 1A;

DESCRIPTION OF THE PREFERRED EMBODIMENTS

The present invention will be described in detail below with reference to the accompanying drawings.

Figure 1A:
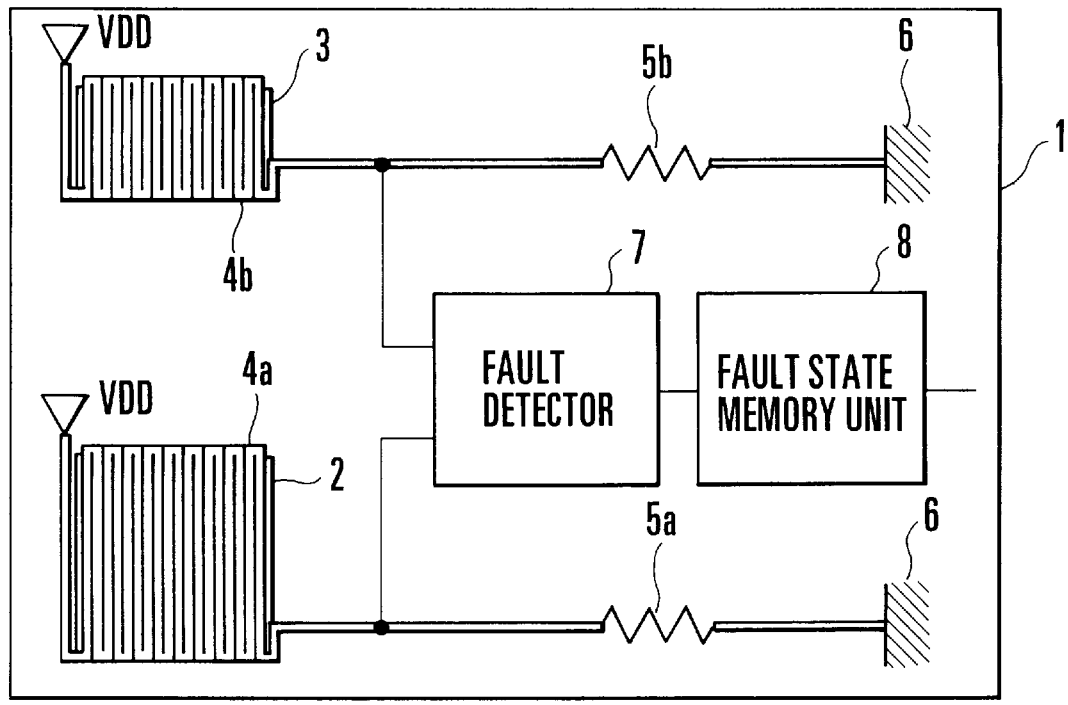
FIG. 1A is a view schematically showing a semiconductor device according to an embodiment of the present invention.

FIG. 1A schematically shows a semiconductor device according to an embodiment of the present invention. Referring to FIG. 1A, an EEPROM 2 and a random circuit 3 are formed as integrated circuits on a semiconductor chip 1. Conductive light-shielding protective wiring layers 4a and 4b made of Al are respectively formed on the EEPROM 2 and the random circuit 3. The material constituting the protective wiring layers 4a and 4b is not limited to Al, and another conductive light-shielding metal material such as Cu or Ti may also be used.

One end of each of the protective wiring layers 4a and 4b is connected to a power supply VDD, and the other end is connected to ground 6 through a corresponding one of resistors 5a and 5b. The protective wiring layers 4a and 4b have predetermined widths and are formed on the EEPROM 2 and the random circuit 3 such that adjacent wires are spread in a zigzag shape at a very small interval without contacting each other. That is, the protective wiring layers 4a and 4b function as light-shielding films covering predetermined regions corresponding to the EEPROM 2 and the random circuit 3. This structure prevents light from entering a portion below the covered region.

A fault detector 7 is connected to the protective wiring layers 4a and 4b between the EEPROM 2 and the resistor 5a and between the random circuit 3 and the resistor 5b. A fault state memory unit 8 is connected to the fault detector 7 to store an output from the fault detector 7.

Figure 1B:
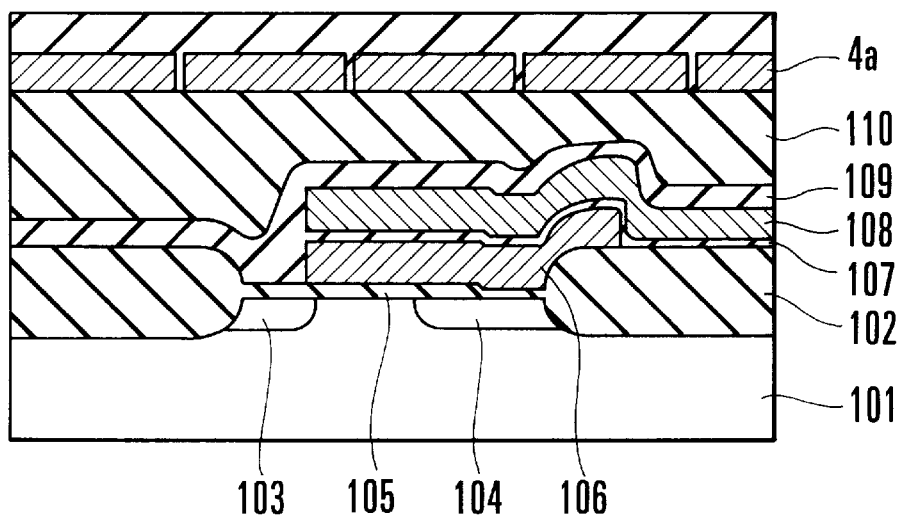
FIG. 1B is a sectional view of the main part of an EEPROM shown in FIG. 1A.

FIG. 1B shows the main part of the EEPROM 2 in FIG. 1A. Referring to FIG. 1B, a source 103 and a drain 104 are formed at a predetermined interval in a region defined by a field oxide film 102 on a p-type semiconductor substrate 101. A floating gate 106 electrically insulated from surroundings is formed through a gate insulating film 105 on the semiconductor substrate and the drain between the source 103 and the drain 104. A control gate 108 is formed on the floating gate 106 and the field oxide film 102 through an insulating film 107.

The floating gate 106 and the control gate 108 are made of heavily doped polysilicon. The protective wiring layer 4a shown in FIG. 1B is formed on the semiconductor substrate 101 including the control electrode 108 through interlevel insulating films 109 and 110. The protective wiring layer 4a is formed to have a small interval determined by the interlevel insulating film 110 so as to prevent adjacent interconnections from contacting each other.

In the above structure, part of the gate insulating film 105 between the floating gate 106 and the drain 104 is formed as thin as about 10 nm. In a data erase, when the control gate 108 is applied with a positive voltage much higher than a voltage to the drain 104, electrons enter the floating gate 106 from the drain 104 in the region of the thin gate insulating film 105. In a data write, by changing the polarity of the voltage applied to the control gate 108, the electrons within the floating gate 106 are removed to the drain 104.

During the operation of the semiconductor device, a power supply voltage VDD is kept applied to the protective wiring layers 4a and 4b, and the potentials of the protective wiring layers 4a and 4b are kept at potentials (normal potentials) defined by the resistors 5a and 5b. When the light-shielding film is damaged, i.e., the protective wiring layer 4a is disconnected, the potential between the disconnected portion of the protective wiring layer 4a and the resistor 5a changes to an abnormal potential different from the normal potential. Similarly, when the protective wiring layer 4b is disconnected, the potential between the disconnected portion of the protective wiring layer 4b and the resistor 5b changes to an abnormal potential different from the normal potential.

The fault detector 7 monitors the potential on one end side of each of the resistors 5a and 5b, and upon detecting the abnormal potential at even one end side, outputs an fault (abnormality) detection signal. The fault detection signal output from the fault detector 7 is stored in the fault state memory unit 8.

According to this embodiment, the protective wiring layers 4a and 4b protect the EEPROM 2 and the random circuit 3 from irradiation of light (ultraviolet rays). Therefore, in, e.g., the EEPROM 2, stored data can be protected from being erased by irradiation of light (ultraviolet rays).

In addition, it can be detected without externally observing the semiconductor device that the protective wiring layer 4a or 4b is damaged, and an abnormality has occurred in stored data by irradiation of light through the damaged portion. That is, if the protective wiring layer 4a or 4b is damaged, a fault detection signal is output from the fault detector 7 and stored in the fault state memory unit 8. By checking the memory contents of the fault state memory unit 8, an abnormality in stored data can be detected.

FIG. 2 shows the fault detector 7 and the fault state memory unit 8.

Referring to FIG. 2, the fault detector 7 is constituted by inverters 71 and 72 for respectively inverting input signals from the protective wiring layers 4a and 4b, and an OR circuit 73 for ORing outputs from the inverters 71 and 72. The fault state memory unit 8 is constituted by a flip-flop 81.

In this arrangement, if the protective wiring layers 4a and 4b are not disconnected, the OR circuit 73 receives two "L"-level inputs. Accordingly, the OR circuit 73 outputs an "L"-level signal, and the flip-flop 81 holds the "L"-level signal. To the contrary, if either of the protective wiring layers 4a and 4b is disconnected, either of two inputs to the OR circuit 73 changes to "H" level. Then, the OR circuit 73 outputs an "H"-level signal, and the flip-flop 81 holds the "H"-level signal.

Whether an output from the flip-flop 81 is at "L" or "H" level is checked, and if it is at "H" level, a data abnormality is confirmed to be generated in the semiconductor device in FIG. 1A.

The semiconductor device in FIG. 1A may be formed not to operate when the output from the flip-flop 81 is at "H" level. Alternatively, as shown in FIG. 2, a reset circuit 9 may be connected to the output stage of the flip-flop 81, and the semiconductor device in FIG. 1A may be initialized when the output from the flip-flop is at "H" level. That is, upon detection of a data abnormality in the semiconductor device, the use of the defective semiconductor device is disabled. With this arrangement, a device incorporating the defective semiconductor device can be prevented from malfunctioning.

Figure 3A:
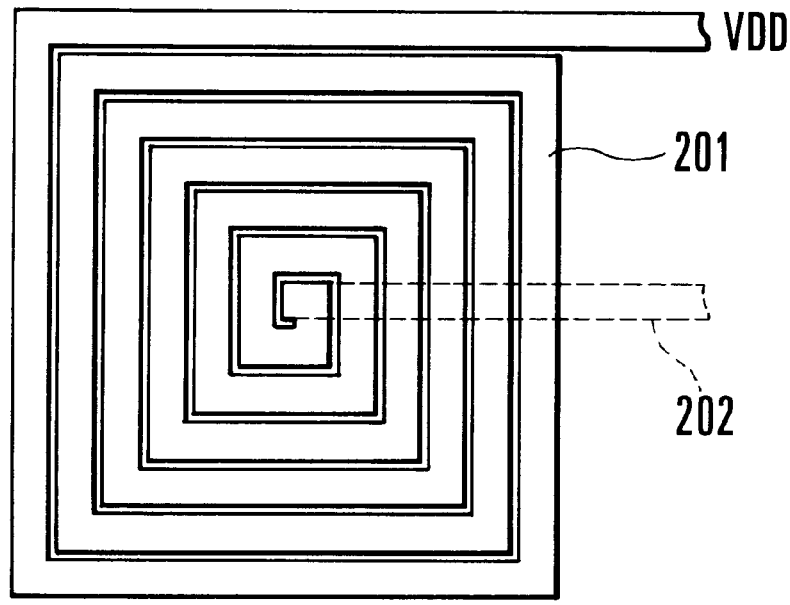
FIGS. 3A and 3B are plan views each showing another example of a protective wiring layer.

The above embodiment has exemplified the case wherein the protective wiring layer constituting the light-shielding film is formed in a zigzag shape. The present invention is not limited to this, and a protective wiring layer 201 may be formed into a rectangular spiral shape, as shown in FIG. 3A. In this case, to connect one end of the protective wiring layer 201 to the power supply, and the other end to the fault detector, the other end 202 of the protective wiring layer must be extracted from the central portion of the protective wiring layer 201 through an insulating film.

Figure 3B:
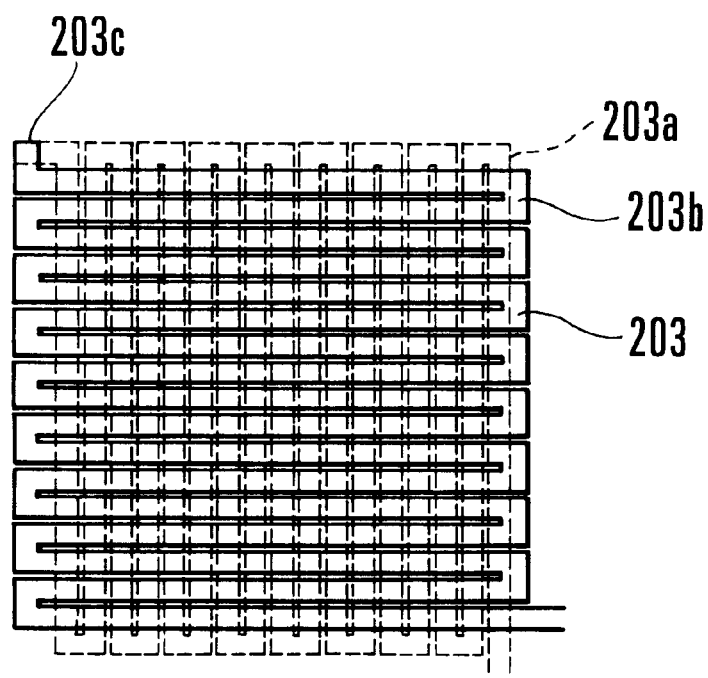
Figure 4:
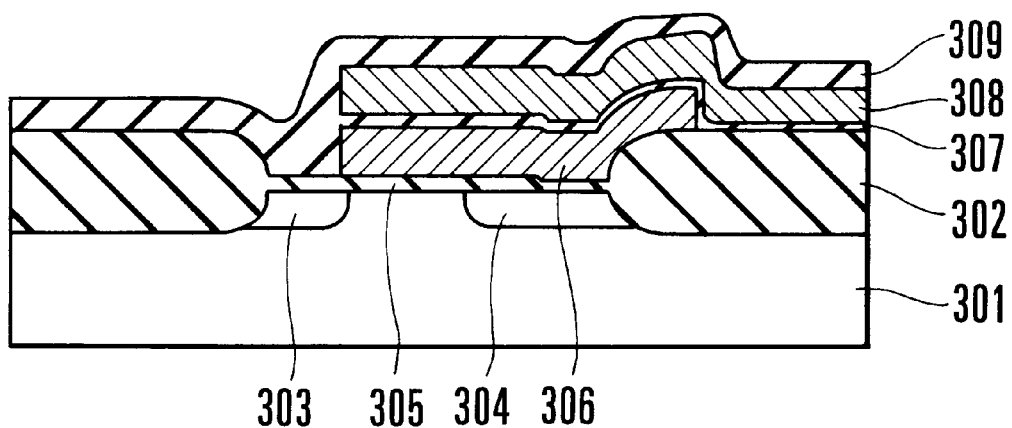
FIG. 4 is a sectional view showing part of a conventional EEPROM cell.
Figure 5:
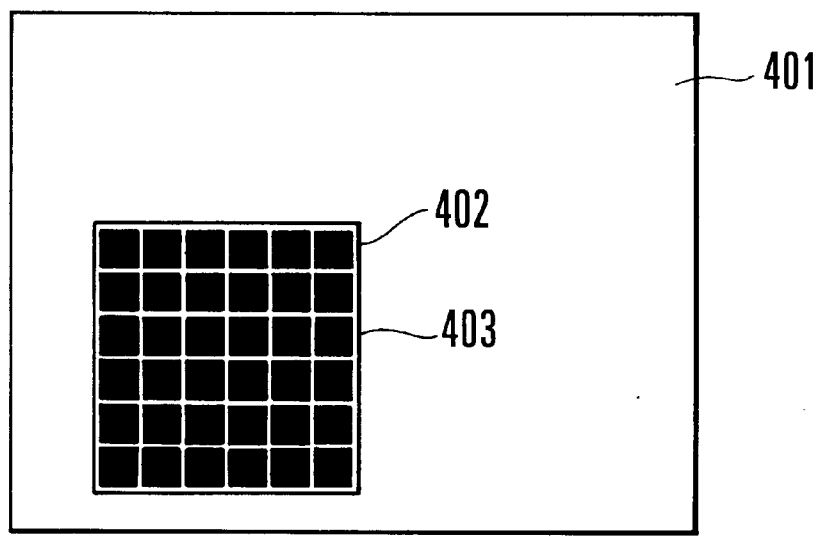
FIG. 5 is a plan view of a semiconductor chip showing the state wherein a light-shielding film is formed on a conventional EEPROM.

As shown in FIG. 3B, a protective wiring layer 203 may be formed in a lattice or reticulate shape with a structure of two wiring layers in directions perpendicular to each other. In this case, the protective wiring layer 203 is obtained by connecting, through a contact 203c, a lower protective wiring layer 203a and a protective wiring layer 203b formed above the lower protective wiring layer 203a through an insulating film. The protective wiring layer 203 can further improve light-shielding properties.

As has been described above, according to the present invention, since the protective wiring layer having light-shielding properties is spread at a very small interval in a predetermined region on a semiconductor chip, the state wherein a data abnormality has occurred by irradiation of light on the integrated circuit owing to the damage to the protective wiring layer can be electrically detected.

What is claimed is:

1. A semiconductor device comprising:

a semiconductor chip on which at least one integrated circuit is formed;

a protective wiring layer formed to be spread on said integrated circuit at a very small interval, and made of a conductive light-shielding material, said protective wiring layer being applied with a power supply voltage upon operating said integrated circuit; and abnormality detecting means for monitoring the voltage applied to said protective wiring layer and outputting an abnormality detection signal when the monitored voltage is an abnormal voltage.

2. A device according to claim 1, further comprising:

fault state memory means for holding the abnormality detection signal output from said abnormality detecting means and storing a fault state of said integrated circuit.

3. A device according to claim 1, further comprising:

reset means for stopping an abnormal operation of said integrated circuit in accordance with the abnormality detection signal output from said abnormality detecting means.

4. A device according to claim 1, wherein said protective wiring layer formed on said integrated circuit has one end connected to a power supply and the other end grounded through a resistor, and said abnormality detecting means monitors a voltage at a connection point between the other end of said protective wiring layer and said resistor.

5. A device according to claim 1, wherein said protective wiring layer is formed into a zigzag shape on said integrated circuit, and zigzag portions of said protective wiring layer are electrically insulated by a small-width insulating film.

6. A device according to claim 1, wherein said protective wiring layer is formed into a spiral shape on said integrated circuit, and spiral portions of said protective wiring layer are electrically insulated by a small-width insulating film.

7. A device according to claim 1, wherein said protective wiring layer comprises:

a lower protective wiring layer formed into a zigzag shape in one direction; and an upper protective wiring layer formed into a zigzag shape in a direction perpendicular to said lower protective wiring layer, and electrically connected to said lower protective wiring layer through a contact, zigzag portions of said lower protective wiring layer and zigzag portions of said upper protective wiring layer being electrically insulated by small-width insulating films, and said lower and upper protective wiring layers being electrically insulated by an insulating film.

8. A device according to claim 1, wherein said integrated circuit is constituted by an electrically erasable programmable read only memory.

9. A semiconductor device, comprising:

at least one integrated circuit;

a protective wiring layer formed proximal to said integrated circuit; and a detector, coupled to said protective wiring layer, said detector outputting a fault detection signal in response to a break in said protective wiring layer.

10. A semiconductor device, according to claim 9, further comprising:

a voltage source, coupled to a first end of said protective wiring layer; and a resistor, coupled to a second end of said protective wiring layer and to a ground potential, wherein said detector is coupled to said protective wiring layer at said second end thereof.

11. A semiconductor device, according to claim 9, further comprising:

a memory, coupled to said detector, said memory retaining a value indicating said fault detection signal provided by said fault detector.

12. A semiconductor device, according to claim 11, further comprising:

a reset circuit, coupled to said memory, said reset circuit providing a signal that disables use of said integrated circuit in response to said memory retaining a value indicating said fault detection signal.

13. A semiconductor device, according to claim 11, wherein said memory includes a flip-flop.

14. A semiconductor device, according to claim 9, wherein said protective wiring layer is at least one of zig-zag shaped, spiral shaped, and a lattice having a first set of wires predominantly perpendicular to a second set of wires.

15. A semiconductor device, comprising:

at least one integrated circuit;

protective wiring layer means for providing a protective layer for said integrated circuit; and detector means, coupled to said protective wiring layer means, for detecting a break therein.

16. A semiconductor device, according to claim 15, further comprising:

memory means, coupled to said detector means, for retaining a fault detection signal provided by said detector means.

17. A semiconductor device, according to claim 16, further comprising:

reset circuit means, coupled to said memory means, for providing a signal for disabling said integrated circuit in response to said fault detection signal.

18. A semiconductor device, according to claim 16, wherein said memory means includes a flip-flop.

19. A semiconductor device, according to claim 15, wherein said protective wiring layer means includes a wiring layer that is at least one of zig-zag shaped, spiral shaped, and formed as a lattice having a first set of wires predominantly perpendicular to a second set of wires.

20. A semiconductor device, according to claim 15, wherein said detector means includes a comparitor that compares a reference signal with a signal provided by said protective wiring layer means.

* * * * *